United States Patent [19]
Dorman

[11] Patent Number: 4,751,381
[45] Date of Patent: Jun. 14, 1988

[54] FAST DITHER DETECTOR FOR FIBER OPTIC SENSOR

[75] Inventor: Richard A. Dorman, Troy, N.Y.

[73] Assignee: Mechanical Technology Incorporated, Latham, N.Y.

[21] Appl. No.: 896,604

[22] Filed: Aug. 13, 1986

[51] Int. Cl.$^4$ .............................................. H01J 5/16
[52] U.S. Cl. ................................. 250/227; 250/214 R
[58] Field of Search ................... 250/227, 214 R, 201, 250/204, 231 R, 203 R; 369/44, 45, 46; 350/96.1; 318/631

[56] References Cited
U.S. PATENT DOCUMENTS 4,352,981  10/1982  Sugiyama et al. ................... 250/201
4,374,323  2/1983  Winslow et al. ...................... 369/45

Primary Examiner—David C. Nelms
Attorney, Agent, or Firm—Joseph V. Claeys; Joseph C. Sullivan

[57] ABSTRACT

This invention relates to a detection circuit for use in a servo controlled fiber optic sensor. A low noise signal with an amplitude proportional to the magnitude of the synchronous detection output is produced without the use of filter by a calculation of the average vale of the synchronous detector output signal driving one complete cycle of the dither signal cycle. This value is fed into sample and hold circuitry, which in turn controls the series motor.

3 Claims, 4 Drawing Sheets

FAST D.C. DETECTOR MICROTRAK

FAST D.C. DETECTOR MICROTRAK

FAST DITHER DETECTOR FOR FIBER OPTIC SENSOR

BACKGROUND OF THE INVENTION

The time response of a tracking system of the type used in servo controlled fiber optic sensors can be limited by the type of dimensional measurement application to which the system can be applied. Typical systems are described in copending applications: Ser. No. 709,582 entitled "Precision Optical Displacement Measuring Instrument Using Servo Controlled Fiber Optic Sensor" now U.S. Pat. No. 4,674,882; Ser. No. 709,563 entitled "Improved Fiber Optic Sensor Probe"; and Ser. No. 709,560 entitled "Optical Configuration of Fiber Optic Sensor For Dynamic Response About The Optical Null", now abandoned, all of which were filed Mar. 8, 1985 and which we incorporated herein by reference. One of the primary limitations on such a system time response is often the response time of the circuitry used to produce a low noise position error signal proportional to the amplitude of the detected dither signal. Filtering of the detected dither signal is necessary to eliminate the harmonics of the dither frequency that are present in this signal. Filter circuitry that will attenuate dither signal harmonics generally has a slow response time that affects the time response of the axis motion.

One solution to this problem is to raise the values of both the dither frequency and the dither harmonic filter so that the filter response time is no longer a major factor in determining the axis motion response time. This solution is not practical for dither frequency values above a few hundred hertz because of the difficulty of designing the spring/mass system containing the lens assembly for the higher critical frequencies. A second solution to the problem is to eliminate the harmonic filter circuitry and develop a signal detection circuit that attenuates the harmonic signal components without affecting the system time response.

SUMMARY OF THE INVENTION

A detection circuit which will produce a low noise signal with an amplitude proportional to the magnitude of the synchronous detector output, and which will eliminate dither signal components without the use of filtering is proposed. The circuit derives timing reference information from the dither reference signal and performs the detection of the average value of the synchronous detector output signal during one complete period of the dither signal. This detection process performs every other dither signal cycle (it is possible to perform this detection process each dither signal cycle, however, in the preferred embodiment, the circuit requires that the detection be performed every other cycle), and the signal at the detector circuit output is held for two complete dither signal periods until a new detected value is available. The detector circuit output signal will be sent to the position control circuitry to command a change in the axis drive motor position. This motor position change will minimize the value of the synchronous detector output signal.

The detection circuit is connected into the system between the synchronous detector and the position control circuitry. The filter capacitors that are presently in the position control circuit to attenuate the dither signal harmonic components are removed. Readjustment of the position control constants is required to compensate for the lower phase shift in the circuitry.

DESCRIPTION OF THE PREFERRED EMBODIMENT

Figure 1:
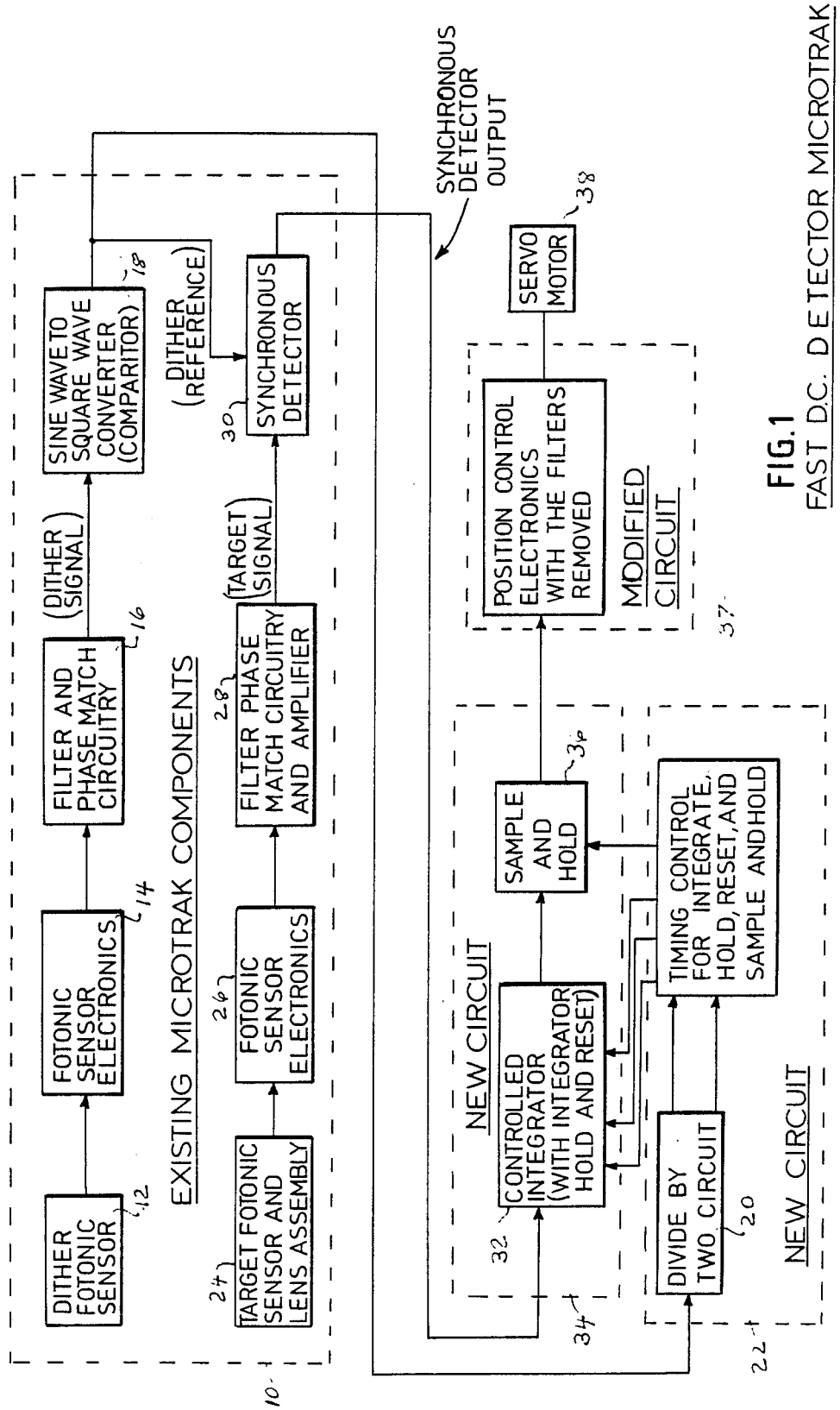
FIG. 1 is a block diagram of a tracking system with the dither detector circuit of this invention included.

FIG. 1 is a block diagram of a system incorporating the detector of the subject invention. The fiber optic sensor components are indicated by the numeral 10 wherein the signal from dither sensor 12 is fed to electronics 14 and thereafter to filter and phase match circuitry 16. The output of this circuit is the dither signal and it is fed to sine wave to square wave converter 18 and its output is fed to divide by two circuit 20 of block 22. The components within block 22 are part of the present invention.

Simultaneously with the above, a signal is received from the target sensor and lens assembly 24 which is fed through suitable electronics 26 and filter, phase match and amplification circuitry 28 as a target signal to the synchronous detector 30, the output of which is fed to integrator 32 in block 34. The components within block 34 are part of the present invention. Block 37 represents modified circuitry which is part of the present invention.

DETECTION CIRCUIT DESCRIPTION

The new components are connected in the signal path between the synchronous detector 30 and the servo system electronics 38, and use the square wave dither reference signal to control the detector circuit operation. The purpose of the detector is to determine the dc value of the synchronous detector circuit output signal without the use of linear filters that produce a slow time response of the closed loop system operation.

The linear filters included in the prior art servo system electronics determine the dc value of the synchronous detector output signal by continously averaging the signal over a time period defined by the filter cutoff frequency. The detector circuit of this invention performs the dc detection function by repetitively integrating the synchronous detector output signal over one period of the dither signal. This integration is performed every other dither signal cycle. A continuous output signal to the servo system electronics is maintained by holding the dc value determined during one integration cycle over the cycle during which another integration is being performed.

Integrator 32 which can be placed in either an integrate, hold, or a reset mode, performs the detection of the synchronous detector output signal dc value. Sample and hold circuit 36 holds the dc value from one integration cycle while a second dc value is being determined. Control of the integrator and the sample and hold circuit is performed by a digital circuit that uses the square wave dither reference signal to control the timing of the dc detection process.

An idealized sketch of the data and control signals involved in the dc detection process are shown in FIG.

2. The target and synchronous detector output signals shown are for an operating condition where the gap between the target and sensor lens is near the focal length of the lens. At this operating condition the target signal frequency is twice the dither frequency because of the nonlinear displacement characteristic of the target sensor.

Figure 2:
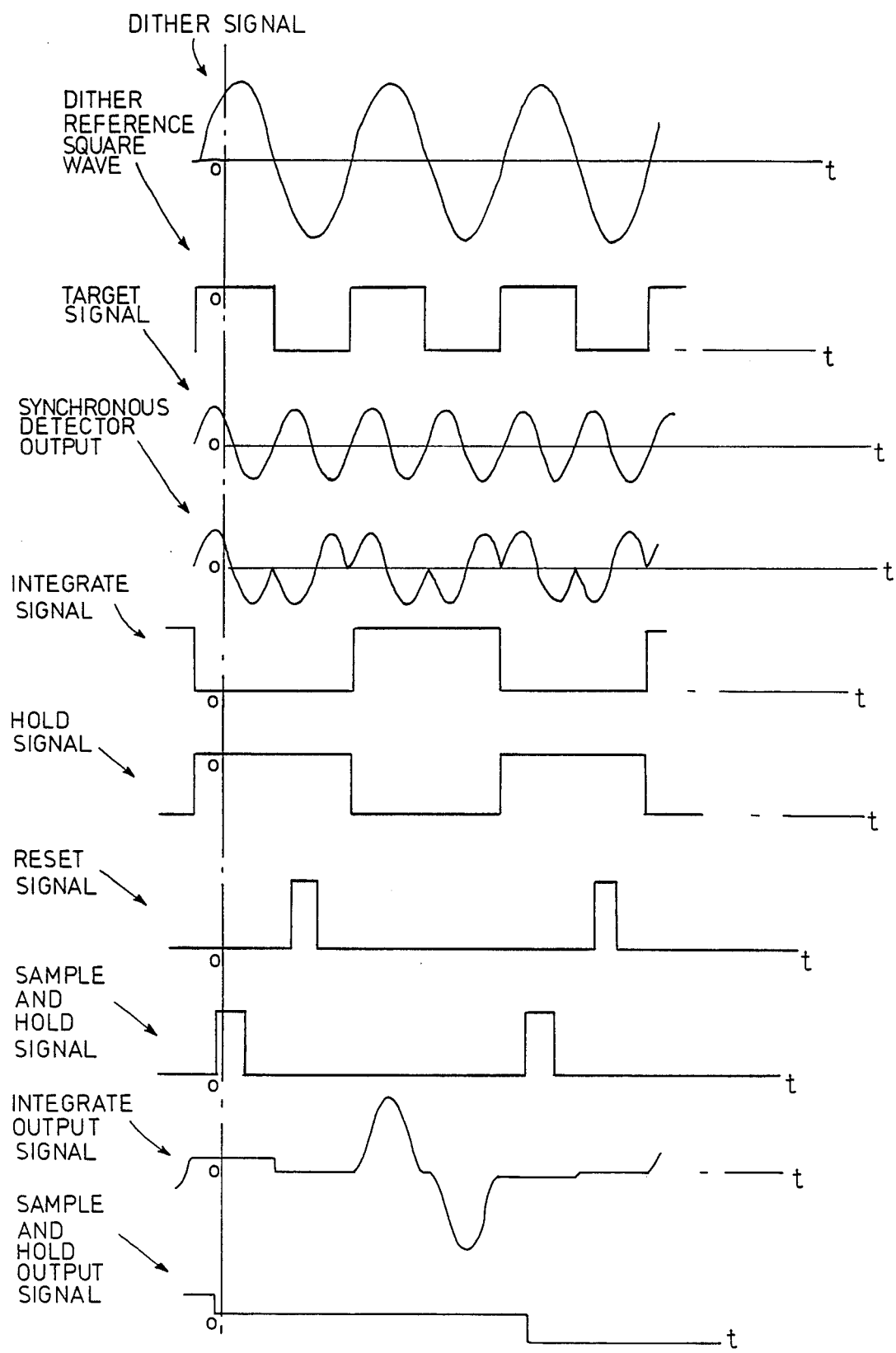
FIG. 2 is an idealized sketch of the data and control signals involved in the dc detection process.

As shown in FIG. 2, the integrate, hold and reset control signals for the integrator are synchronized with the dither reference signal and occur at half the repetition rate of the dither signal. The timing of the control signals is such that just prior to an integration cycle the integrator is reset. Reseting initializes the integrator for the next cycle by removing all of the stored charge on the integrator capacitor. During the integration cycle the integrator output voltage varies in response to the synchronous detector output signal so that the integrator output signal value at the end of the cycle is equal to the average of the synchronous detector output signal. This average value is held by the integrator for a portion of the succeeding dither signal cycle, during which time this value is stored in the sample and hold circuit. After the new value has been stored in the sample and hold circuit, the integrator is reset and signal detection process begins to determine the average value of the succeeding synchronous detector output signal cycle.

The proposed fast detector circuit can determine the average value of the synchronous detector output signal every dither reference signal cycle. To perform the detection every cycle, very short integrator hold and sample and hold signals are required.

Figure 3:
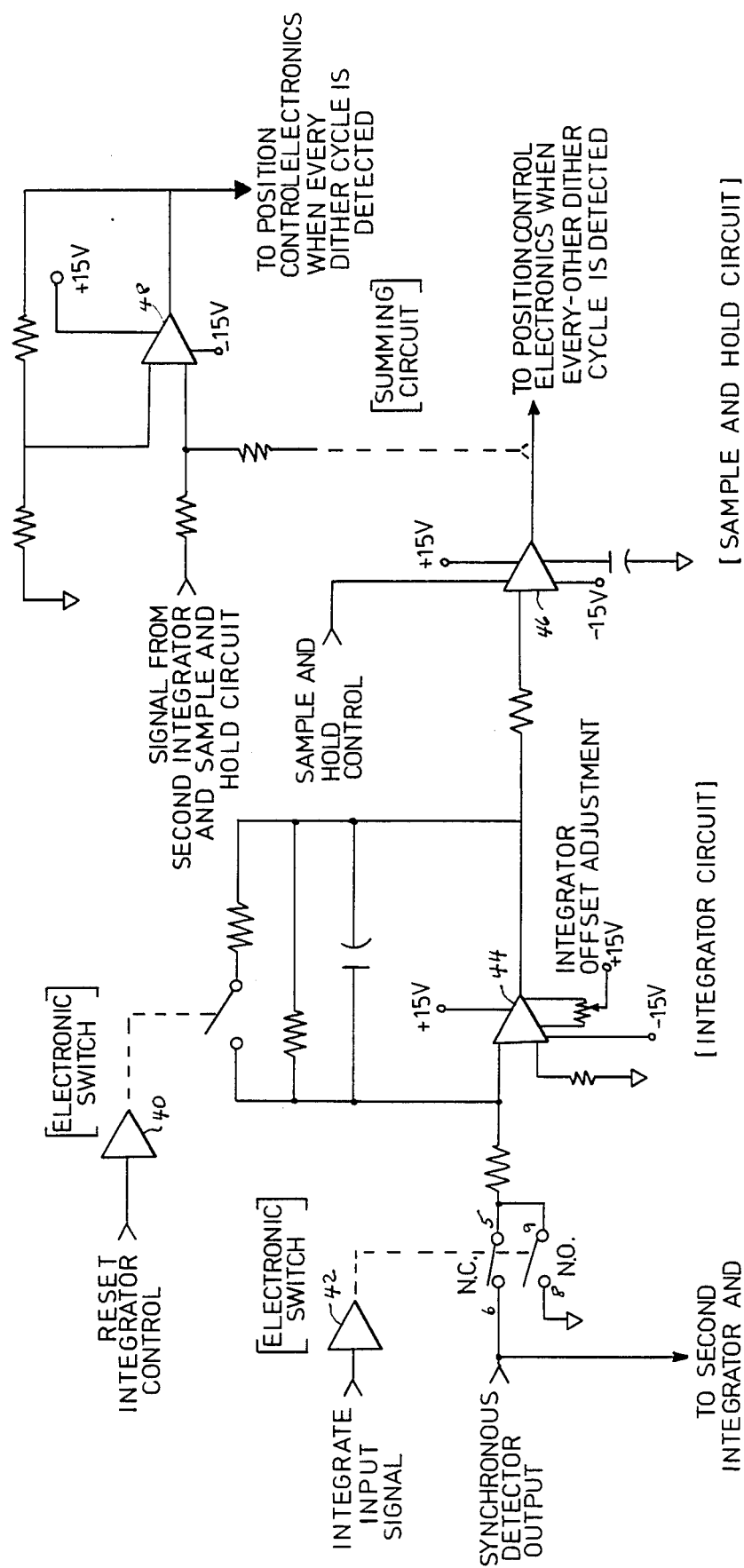
FIG. 3 is a schematic diagram of the integrator and sample and hold circuitry.
Figure 4:
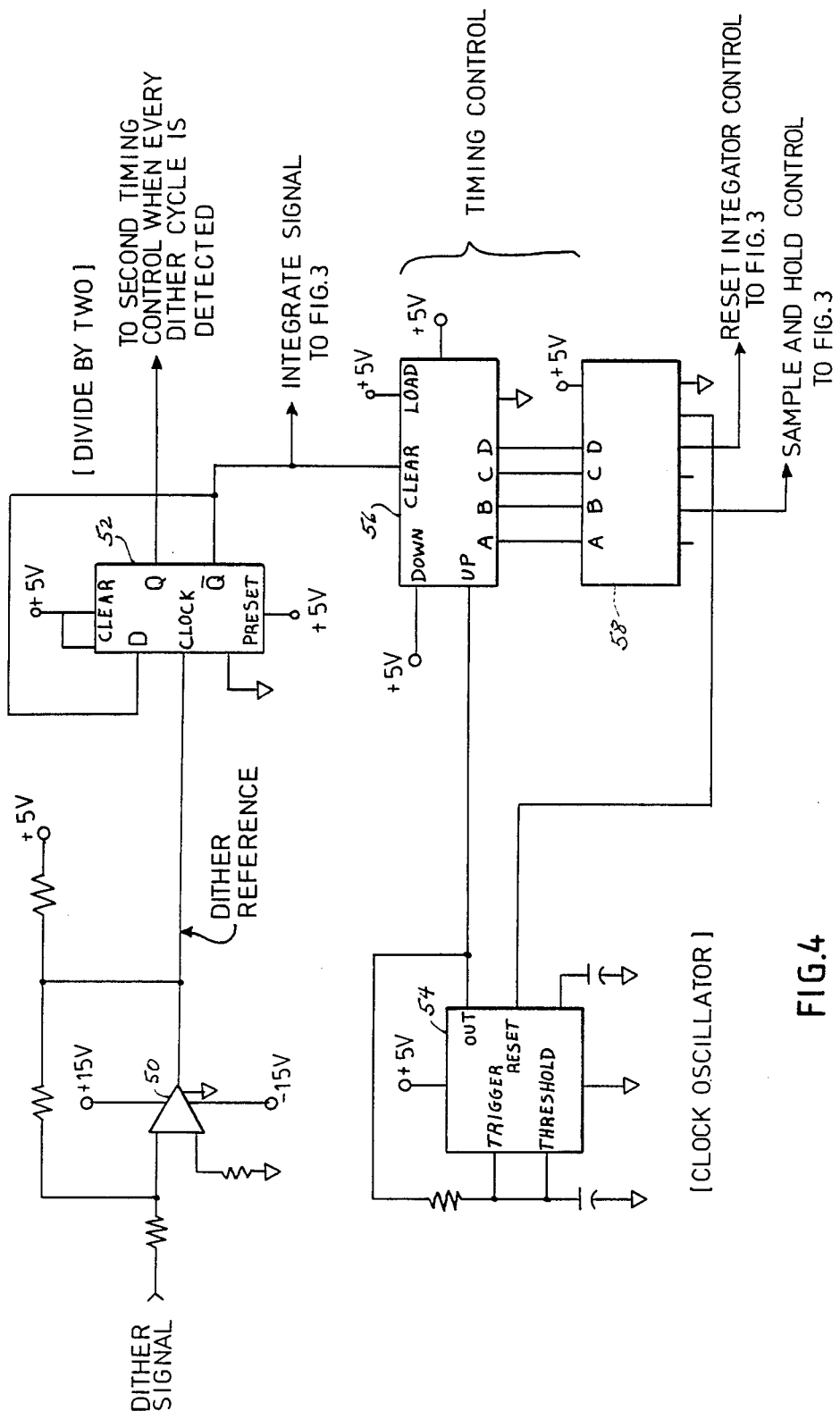
FIG. 4 is a schematic diagram of the digital control circuitry.

FIGS. 3 and 4 show the circuitry involved. FIG. 3 shows the sample integrator and sample and hold circuitry. FIG. 4 shows the digital control circuitry.

Referring to FIG. 3, which is the integrator and sample and hold of block 34, the major components that are used in the circuitry are solid state switches 40 and 42 used to control the flow of signals through the integrator and sample and hold circuit; amplifier 44 which together with capacitors and resistors forms the integrator circuit; sample and hold circuit 46; and amplifier 48 which is used in the circuit when detection of every dither cycle is performed. Switch 42 controls the flow of signal into the integrator circuit. When the contacts 5 and 6 of switch 42 are closed, signal is applied to the integrator, and the integrator performs a long term integration of that signal. This is the normal operation which occurs when detecting the signal value for the selected dither cycle. When switch 42 is placed in a position where terminals 5 and 6 are opened, and terminals 8 and 9 are closed, the integrator is in a hold mode during which the value of the output signal from operational amplifier 44 (Precision Monolithics OP-15) is held at a fixed value, independent of change of input signal. The purpose of switch 42 is to allow one cycle of the dither signal to be entered into the integrator and have that signal integrated, or the value under the curve integrated, to determine a fixed value representative of the signal amplitude. The integrator circuit is placed in a hold mode so that the value can be translated over to the sample and hold circuit. The output of integrator 44 is fed to the input of the sample and hold circuit 46. The sample and hold circuit samples the value of the integrator circuit and holds it for a fixed period, during which a subsequent dither cycle is integrated.

The circuit shown in FIG. 3 that utilizes switch 40, switch 42, circuit 44 and circuit 46, has an operational cycle that detects the value of the dither cycle every other dither cycle. In other words, it will detect a dither cycle, it will skip the next dither cycle, and then the subsequent dither cycle signal is detected. The amplifier 48 is a circuit that is added when the value of every dither cycle is detected. Amplifier 48 is a summing circuit which takes the output of sample and hold circuit 46 and sums the signal from circuit 46 with the signal from an identical detection circuit that contains an integrator and sample and hold.

When a system is assembled to detect only every other dither cycle, the output of the sample and hold circuit 46 is fed directly to the position control electronics. When the value of every dither cycle is detected, the output of sample and hold circuit 46 is fed to the input of circuit 48 and the output of circuit 48 is fed directly to the position control electronics.

The second input signal to amplifier 48, in a system where every dither cycle is detected, comes from a circuit that is identical to the integrator and sample and hold that is shown in FIG. 3.

The input signal to the integrator circuit and sample and hold circuit shown in FIG. 3 comes from the output of the synchronous detector. This connection is shown in FIG. 1. Also shown in FIG. 1 is the output connection from the sample and hold circuitry to the position control electronics. What is not shown in FIG. 1 is the summing amplifier 48 that is shown in FIG. 3. This summing amplifier is between the sample and hold circuit and the position control electronics. When a system is detecting a dither signal amplitude every cycle, it is necessary to have two control integrators and two sample and hold circuits.

The divide-by-two circuit and timing control circuit shown in FIG. 1 is shown in greater detail in FIG. 4. This circuit uses comparator 50, and digital circuitry 52, 54, 56 and 58. Comparator 50 produces a square wave at the dither frequency from the sine wave dither signal. The square wave frequency is divided by two by flip-flop circuit 52. The lower frequency square wave is connected to counter circuit 56 which is a 74193 TTL counter. The combination of counter 56 and CD to decimal converter 58 and LM 555 oscillator circuit 54 make up the timing control circuit that produces the signals that control the integration and sample and hold circuitry shown in FIG. 3. The integrate signal is taken from the output Pin 6 of 52. The integrate signal controls switch 42 of the circuit shown in FIG. 3 to allow the dither signal to be applied to the integrator circuit every other cycle.

The two signals for resetting the integrator and performing the sample and hold function on the integrator output signal are produced at the output of the 7442 circuit 58. The signals that are produced by the timing control circuit are shown in FIG. 2. This figure shows the sequence of the detection operation for the dither signal amplitude.

Clock oscillator 54 generates a square wave signal that is at a higher frequency than the dither signal. The higher frequency signal is fed to the up counting input of the counter 56. The counting operation of the square wave pulses out of oscillator 54 is initiated when the clear signal on the counter 56 goes into a high state. This begins the generation of the reset signal for the integrator and the sample and hold control signal. These two signals have a period that is identical to the period of the clock oscillator signal from oscillator circuit 54.

The timing control circuit composed of oscillator 54, counter 56 and circuit 58 is sufficient to control an integrator and sample and hold circuit that performs detection of every other dither signal cycle. When a circuit that performs detection of every dither cycle is required, a second set of circuitry identical to components 54, 56 and 58 is required to control the operation of the second integrator and sample and hold circuit needed to detect every dither signal cycle amplitude.

Thus has been presented circuitry which performs fast signal detection and eliminates slow time response of dither signal averaging filter.

What is claimed is:

1. A detection circuit for use in a servo controlled fiber optic sensor for producing a low noise signal with an amplitude proportional to the magnitude of an output signal from a synchronous detector of send said fiber optic sensor, the synchronous detector being synchronized by a periodic dither reference signal, the detection circuit eliminating components of said periodic dither reference signal from the output signal in the absence of filtering thereof, including:

means for deriving time reference information from the dither reference signal;
   means for receiving said time reference information, receiving the output from the synchronous detector, and calculating an average value of the output during one complete period of the periodic dither reference signal as determined by said time reference information;
   means for receiving and holding said average value of the output until an updated average value is available from said receiving and calculating means; and
   means for transmitting said average value to the servo.

2. A detection circuit in accordance with claim 1 in which said receiving and calculating means includes means to integrate repetitively the detector output over one complete period of the periodic dither reference signal as determined by said time reference information.

3. A detection circuit in accordance with claim 1 wherein said dither reference signal is a square wave and said transmitting means transmits a constant value throughout a period of said square wave.

* * * * *